United States Patent [19]
Jett, Jr.

[11] Patent Number: 5,610,557
[45] Date of Patent: Mar. 11, 1997

[54] METHOD AND CIRCUIT FOR TRIMMING AN OPERATIONAL AMPLIFIER HAVING DUAL INPUT STAGES

[75] Inventor: William B. Jett, Jr., Los Gatos, Calif.

[73] Assignee: Linear Technology Corporation, Milpitas, Calif.

[21] Appl. No.: 480,696

[22] Filed: Jun. 7, 1995

[51] Int. Cl.$^6$ .................................................. H03F 3/45
[52] U.S. Cl. ........................................ 330/261; 330/255
[58] Field of Search ................................. 330/252, 255, 330/261

[56]     References Cited

U.S. PATENT DOCUMENTS

| | | | |
|---|---|---|---|
| 5,323,121 | 6/1994 | Butler | 330/252 |
| 5,418,491 | 5/1995 | Bowers | 330/261 X |

OTHER PUBLICATIONS

A Precision Trim Technique for Monolithic Analog Circuits, George Erdi, IEEE Journal of Solid–State Circuits, vol. SC–10, Dec. 1975, pp. 412–416.

1–V Operation Amplifier with Rail–to Rail Input and Output Ranges, Jeroen Fonderie, et al., IEEE Journal of Solid–State Circuits, vol. 24, No. 6, Dec. 1989, pp. 1551–1559.

A Quad Low Voltage Rail–to–Rail Operational Amplifier, Robert Vyne et al., IEEE 1992 Bipolar Circuits and Technology Meeting 12.3, pp. 242–245.

NE/SA5230 Product Specification Sheet, Philips Semiconductor–Signetics Linear Products, Apr. 1992, pp. 68–79.

*Primary Examiner*—James B. Mullins
*Attorney, Agent, or Firm*—Fish & Neave; Michael J. DeHaemer, Jr.; Mark D. Rowland

[57]     ABSTRACT

Circuitry is provided for a precision integrated circuit operational amplifier having a complementary pair of differential amplifiers in the input stage. Each differential amplifier is operable over a portion of the common-mode input range to provide a common-mode input range that includes both positive and negative power supply voltages. Methods are provided for trimming the operational amplifier to reduce the input offset voltage of each input stage differential amplifier which reduces the input offset voltage for the operational amplifier as a whole.

22 Claims, 5 Drawing Sheets

METHOD AND CIRCUIT FOR TRIMMING AN OPERATIONAL AMPLIFIER HAVING DUAL INPUT STAGES

BACKGROUND OF THE INVENTION

The present invention relates to integrated circuit operational amplifiers (op-amps) having high precision and a "rail-to-rail" common mode input range. More particularly, for op-amps having two differential input stages, methods and circuitry are provided for trimming the input stages in order to minimize input offset voltage.

The op-amp is a basic building block in the design of many analog electronic circuits. Because commercial op-amp devices are inexpensive, easy to use, and widely available, they can be found in a wide range of electronic devices, from medical instruments to consumer electronics.

Commercial op-amp devices are typically subject to one or more non-ideal performance limitations. For example, actual op-amps have finite values for voltage gain, input impedance, and bandwidth, as well as a non-zero output impedance. In addition, tolerances in manufacturing op-amps may result in other non-ideal characteristics, such as the presence of an input offset voltage, which is discussed further below. Many op-amp circuits have been designed to make their performance closer to that of the ideal op-amp. Frequently performance is improved in one area at the expense of decreased performance in another area.

An op-amp of conventional design has an input stage consisting of a pair of transistors configured as a differential amplifier having two symmetrical circuit branches, wherein each branch includes a transistor coupled to one of the input terminals. In each branch, the transistor produces a signal proportional to the voltage on the corresponding input terminal. The output of the input stage is the difference between the signal in each branch of the differential amplifier. Ideally, the values of corresponding circuit components in the two branches, and hence the branches themselves, are identical, so that when identical voltages are applied to each input, i.e. a common-mode input voltage, the signals in each branch are also identical, and the output of the input stage is zero.

In actuality, the branches are not exactly identical. Manufacturing tolerances can cause the values of circuit components in one branch of the input stage to differ slightly from the values of the corresponding component in the other branch. Because of this lack of symmetry, the branches of the differential amplifier have slightly different characteristics, causing a common-mode input voltage to result in nonequal signals in each branch of the differential amplifier. Therefore the output signal, which corresponds to the difference between the two branch signals, may be non-zero for a common-mode input signal. To compensate for a non-zero output resulting from a common-mode input a small voltage difference can be applied between the input voltages to produce a zero output voltage. The small voltage difference that would be required to produce an output voltage of zero is called the 'input offset voltage,' or just 'input offset,' and is an electrical characteristic of an op-amp.

While the input offset varies from op-amp chip to the next, a particular op-amp design has associated with it characteristic values of input offset voltage, such as typical and/or maximum values. An op-amp design which exhibits lower characteristic values of input offset voltages than another design is said to be more precise, or to have more precision, than the other design. Manufacturer's frequently include the characteristic values of input offset voltage on an op-amp's specification sheet.

The presence of an input offset voltage in an op-amp introduces a DC offset into the output signal. In some applications, such as designing instrumentation amplifiers, it is necessary to be able to amplify signals having a very small magnitude; particularly, with respect to such applications, reducing the output DC offset by minimizing the input offset voltage of an op-amp is a desirable goal in op-amp design. It is possible using previously known techniques to trim the values of various components in the input stage circuitry, usually resistive elements, in an attempt to restore symmetry to the branches of the differential amplifier and thereby minimize the magnitude of the input offset voltage.

Another characteristic of op-amps of conventional design is the limited range of common-mode input voltages. A common-mode input voltage which is at or near one of the supply voltages ($+V_{CC}$ and $-V_{EE}$) may drive the transistors in the input stage into either a saturation or cutoff condition. This limits the useful range of common-mode input voltages since they must not approach or exceed either of the op-amp's supply voltages. A conventional rule of thumb is that the input signal should not come within about 1 volt of either $+V_{CC}$ or $-V_{EE}$.

For many applications, it is desirable to allow the input signal of an op-amp to have a common-mode input voltage range which includes both $+V_{CC}$ and $-V_{EE}$. This can be accomplished by utilizing an input stage having two complementary differential amplifiers coupled in parallel, wherein one of the differential amplifiers is active for input signals at or near $+V_{CC}$, and the other differential amplifier is active for input signals at or near $-V_{EE}$. The outputs of the two differential amplifiers are then summed to obtain an output for the input stage. For input signals that are not near either supply voltage, both of the differential amplifiers are active to a varying degree. Additional circuitry may be incorporated to provide for a smooth transition between states in which only one or the other of the differential amplifiers is active as a common-mode input voltage varies from one supply voltage to the other. In this way, the common-mode input range is extended to include both power supply voltages.

However, the increased complexity of an op-amp having dual differential amplifiers in the input stage, potentially increases the number of errors during the fabrication process. Just as variations in symmetry between branches of a single differential input stage cause an op-amps of conventional design to exhibit a characteristic input offset voltage, an operational amplifier design employing dual input stage differential amplifiers is subject to similar variations in the symmetry between branches of each of its differential amplifiers. Accordingly, an op-amp having dual differential amplifiers typically has an input offset voltage that depends upon which of the input stages is active. Thus, while dual input stage differential amplifiers have been used to successfully extend the common-mode input range in the prior art, previously known realizations have been untrimmed and therefore lack precision.

In view of the foregoing, it would be desirable to provide an op-amp having a common-mode input range which includes the voltage on both supply rails, and which has low characteristic input offset voltages.

It would also be desirable to provide circuitry and methods for improving the precision of an op-amp having dual input stage differential amplifiers.

In addition, it would be desirable to be able to trim both differential amplifiers of an op-amp having dual input stage differential amplifiers in a manner that allows the effect of trimming to be closely approximated using conventional analytical techniques.

SUMMARY OF THE INVENTION

It is therefore an object of the present invention to provide an op-amp having a common-mode input range which includes the voltage on both supply rails, and which has low characteristic input offset voltages.

It is also an object of the present invention to provide circuitry and methods for improving the precision of an op-amp having dual input stage differential amplifiers.

It is a further object of the present invention to provide circuitry and methods of trimming both differential amplifiers of an op-amp having dual input stage differential amplifiers in a manner that allows the effect of trimming to be closely approximated using conventional analytical techniques.

In accordance with these and other objects of the present invention an op-amp is described having a complementary pair of input stage differential amplifiers. A current steering circuit directs a constant biasing current to the differential amplifiers in a ratio that is dependent on a common-mode input voltage to the op-amp, thereby controlling the relative contribution of each differential amplifier to the signal output by the op-amp's input stage. Resistive elements are provided that may be trimmed to improve the symmetry between the branches of each differential amplifier, and to minimize differences between the two differential amplifiers. A summing and conversion circuit is also provided which combines the signals from each of the differential amplifiers and converts the sum to a single-ended output signal.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
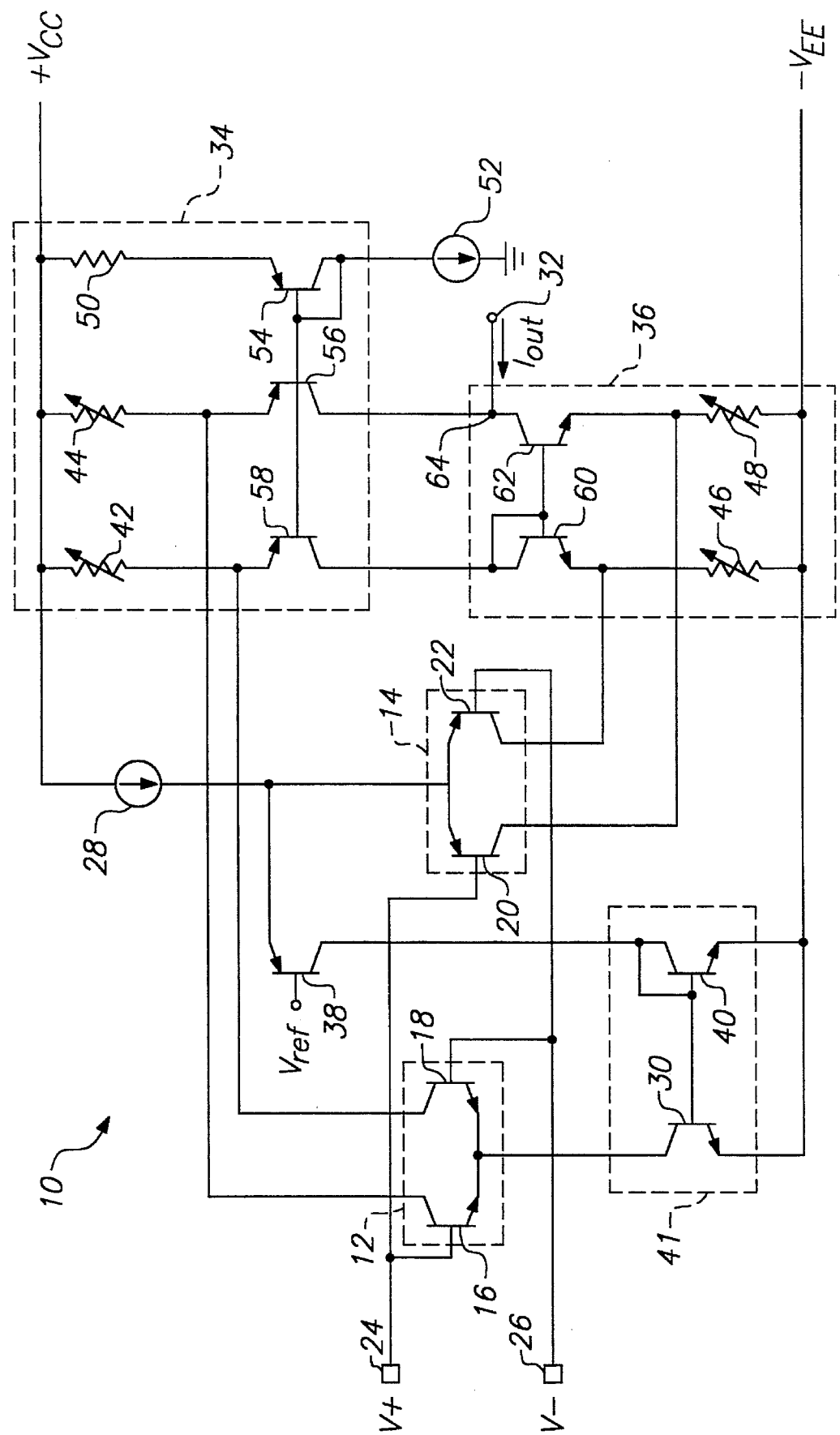
FIG. 1 is a schematic diagram of input stage circuitry of an op-amp having trimmable, dual input stage, differential amplifiers.

FIG. 1 shows known input stage circuitry 100 for an operational amplifier having dual input stages. Circuit 10 comprises a complementary pair of differential amplifiers 12 and 14 coupled in parallel between positive input terminal 24 and negative input terminal 26. Differential amplifier 12 is formed by NPN transistors 16 and 18, and differential amplifier 14 is formed by PNP transistors 20 and 22. Transistors 20 and 22 are biased by constant current source 28, so that the total current conducted by transistors 20 and 22 is substantially constant. As long as the voltage on the bases of transistors 20 and 22 remain equal, their respective collector currents remain equal. However, if a differential is established between the base voltages, a corresponding differential between the collector currents of transistors 20 and 22 is produced.

Transistor 30 provides a constant current sink for transistors 16 and 18. Similar to transistors 20 and 22, transistors 16 and 18 function to produce differential collector currents as a function of the difference between their base voltages. The differential collector currents of differential amplifiers 12 and 14 are summed and converted to a single ended output current, $I_{out}$, at output node 32, by resistor-ratioed current mirrors 34 and 36, the operation of which will be described further hereinbelow.

PNP transistor 38 forms part of a current steering circuit that controls when differential amplifiers 12 and 14 are active. A biasing voltage, $V_{ref}$, supplied to the base of transistor 38 determines the common-mode input signal level at which the transition from one input stage differential amplifier to the other occurs. For common-mode input voltages much lower than $V_{ref}$, transistor 38 is biased off and the current from current source 28 flows through transistors 20 and 22, keeping differential amplifier 14 active. Conversely, for common-mode input voltages much higher that $V_{ref}$, transistor 38 is biased fully on and all of the current from current source 28 flows to transistor 40 instead of transistors 20 and 22, thereby biasing transistors 20 and 22 into cutoff and differential amplifier 14 is inactive.

Transistors 30 and 40 comprise unity gain current mirror 41, so that reference currents flowing through transistor 40 cause transistor 30 to sink substantially equal currents, which must flow from transistors 16 and 18, thereby keeping differential amplifier 12 active. For intermediate common-mode input voltages transistor 38 acts to smoothly transition between a condition in which only transistors 16 and 18 are active and a condition in which only transistors 20 and 22 are active.

The circuitry comprised of transistors 54 and 56, and emitter resistors 50 and 44, form part of resistor-ratioed current mirror 34. In operation, transistor 56 conducts sufficient collector current to cause the voltage drop across resistor 44 to be substantially equal to the voltage drop across resistor 50. Because transistor 54 is in a diode configuration, the current through resistor 50 is substantially equal to the collector-emitter current of transistor 54, which is equal to the current sunk by constant current source 52. Unless otherwise noted, currents are assumed to flow from left to right or from top to bottom when referring to the circuits of the figures. Applying Ohm's Law to the circuit of FIG. 1 shows that the voltage drop across resistor 50 is equal to the product of its resistance and its current, or $I_{52} \cdot R_{50}$. Therefore, the current through resistor 44 is given by:

$$I_{R44} = I_{52} \cdot R_{50}/R_{44}. \tag{1}$$

Hence, the current through resistor 44 is substantially equal to the value of a reference current flowing through transistor 54 scaled by the ratio of the resistance of resistor 50 to that of resistor 44. Similarly, transistor 58 conducts sufficient collector current to cause the voltage drop across resistor 42 to also equal the voltage drop across resistor 50, and the current through resistor 42 may be shown as:

$$I_{R42} = I_{52} \cdot R_{50}/R_{42}. \tag{2}$$

Resistor-ratioed current mirror 36, which is comprised of transistors 60 and 62, and resistors 46 and 48, functions in a manner analogous to current mirror 34. The collector current through transistor 62 is equal to the reference current flowing through the collector of transistor 60 scaled by the ratio of the resistance of resistor 46 to that of resistor 48, or:

$$I_{E62} = I_{E60} \cdot R_{46}/R_{48}. \tag{3}$$

Next, applying Kirchoff's current Law to node 64 of FIG. 1, the output current, $I_{out}$, is the difference between the collector current of transistors 62 and 56, or:

$$I_{out} = I_{C62} - I_{C56}. \tag{4}$$

Still referring to FIG. 1, resistors 42, 44, 46, and 48 are shown as having variable resistances in accordance with the present invention. In particular, the circuitry of FIG. 1 is preferably implemented as integrated circuitry whereby resistors 42, 44, 46, and 48 are fabricated such that they may be trimmed during the manufacturing process. Thus the resistors' individual resistances may be varied over a small range about some nominal value. Techniques for fabricating trimmable IC resistors, such as "Zener zapping", blowing metal links, or direct laser trimming of thin film resistors, are known and may be used in conjunction with the principles of the present invention. Through careful trimming of resistors 42, 44, 46, and 48, of FIG. 1, in accordance with the principles of the present invention the input offset voltage of each of the input stage differential amplifiers is minimized, as is discussed in more detail in connection with FIGS. 2 and 3, thereby producing an op-amp with a wide common-mode input voltage range that has precision.

FIGS. 2 and 3 illustrate the effects of trimming resistors 42 and 44, or 46 and 47 respectively. In analyzing the operation of the circuit of FIG. 1, the effect of varying the values of resistors 42 and 44, or 46 and 48 will be considered independently. Furthermore, the analysis is performed initially with transistors 16 and 18 active, and then it is performed with transistors 20 and 22 active. Overall circuit operation is then determined by superposition, whereby the complete circuit response is the sum of the four independent responses.

Figure 2A:
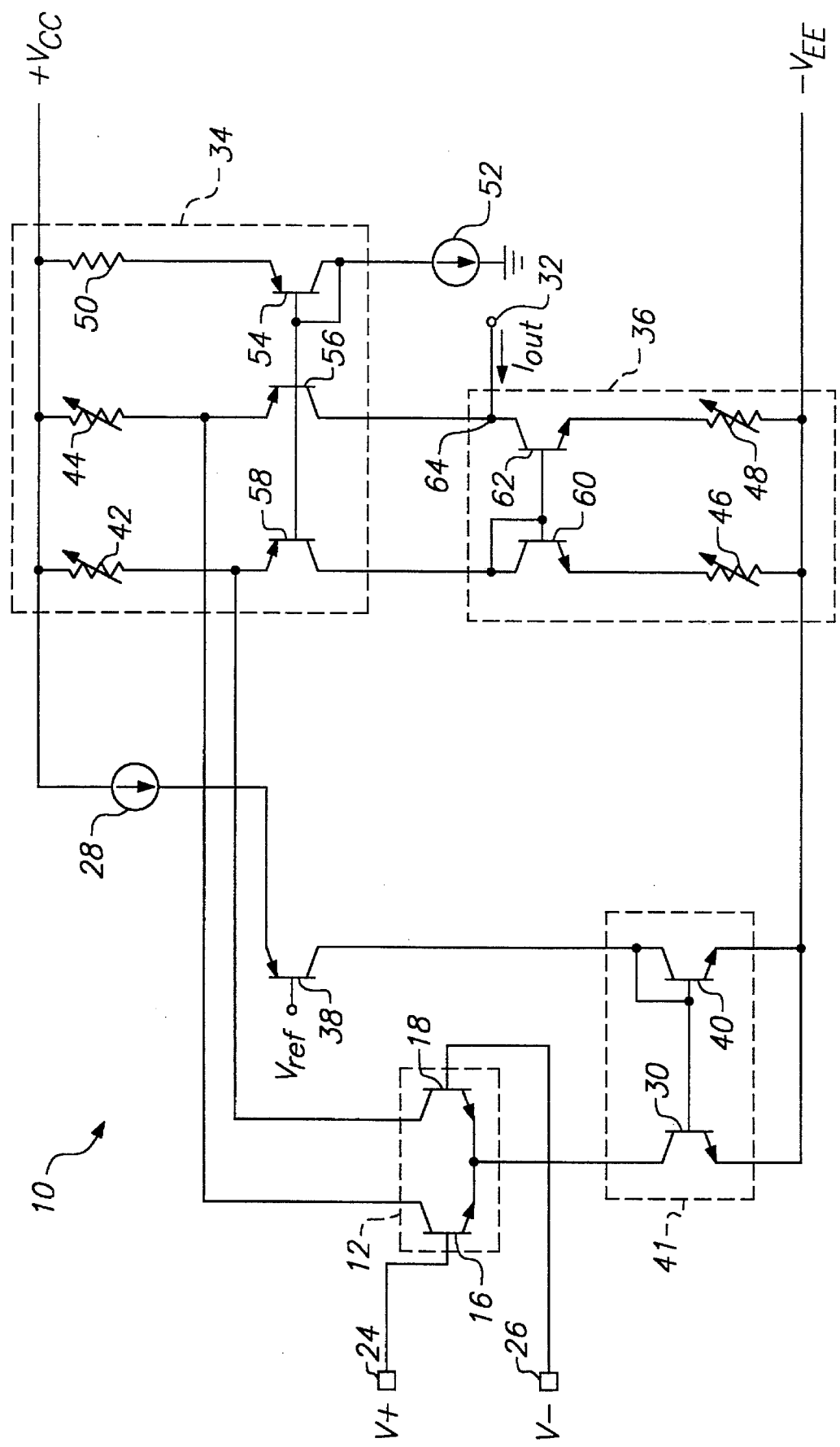
FIGS. 2A and 2B are partial schematic diagrams of the circuit of FIG. 1 which are used in illustrating the effects of trimming the op-amp in accordance with principles of the present invention.

First, the effects of varying the resistances of resistors 42 and 44 are considered while the values of resistors 46 and 48 are held constant and equal. FIG. 2A assumes that transistors 16 and 18 are active, while FIG. 2B assumes that transistors 20 and 22 are active. In analyzing FIGS. 2A and 2B, current sources 28 and 52 are assumed to each produce a current of 2I.

Referring to FIG. 2A, when the common mode input voltage is sufficiently high, transistor 38 is biased fully on, and the current of source 28 is directed to the reference side of current mirror 41 formed by transistors 30 and 40. As a result, transistor 30 is forced to sink a current equal to the current of source 28. Because the input is assumed to be a common-mode voltage, transistors 16 and 18 conduct equally, and therefore each transistor conducts a collector current which is given by:

$$I_{C16} = I_{C18} = I_{28}/2. \tag{5}$$

As previously derived, transistor 56 conducts sufficient current so that the current through resistor 44 is as shown in equation (1). However, when transistors 16 and 18 are active, a portion of the current through resistor 44 flows to the collector of transistor 16, reducing the collector current of transistor 56 by an equal amount. Assuming that the current supplied by current source 28 equals 2I, and combining equations (1) and (5), the collector current of transistor 56 may be shown to be:

$$I_{C56} \approx I_{E56} = 2I \cdot R_{50}/R_{44} - I. \tag{6}$$

Similarly, by combining equations (2) and (5) the collector current of transistor 58 may be shown to be:

$$I_{C58} \approx I_{E58} = 2I \cdot R_{50}/R_{42} - I. \tag{7}$$

Figure 2B:
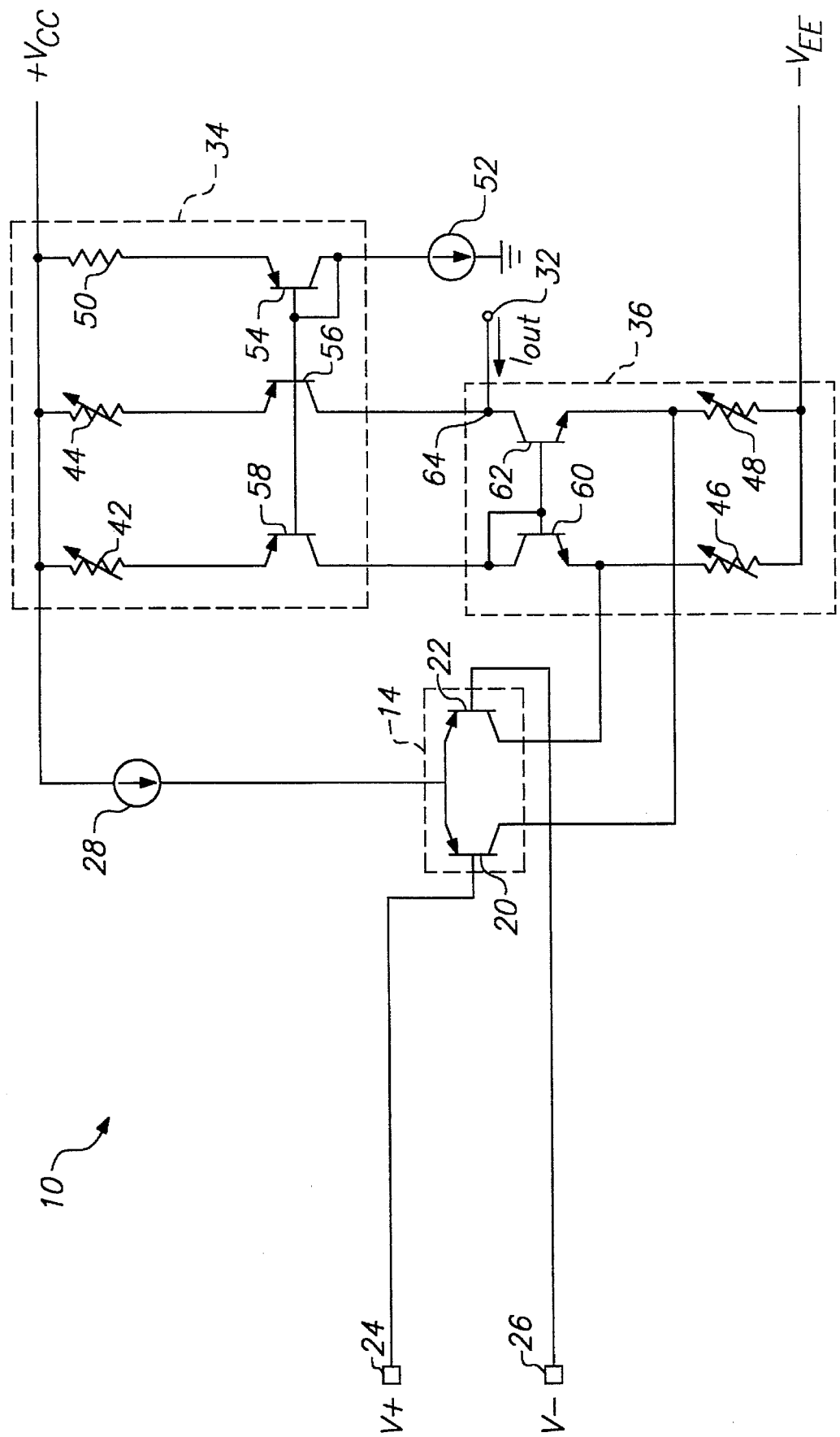

For the purpose of analyzing FIGS. 2A and 2B resistors 46 and 48 are assumed to have equal resistance. Substituting $R_{46} = R_{48}$ into equation (3), and noting that the base currents of transistors 60 and 62 is small relative to their collector and emitter currents, the collector current of transistor 62 may be shown to be equal to the collector current of transistor 60. From FIG. 2A, the collector current of transistor 58 flows into the collector of transistor 60, therefore, the collector current of transistor 62 is equal to the collector current of transistor 58, or:

$$I_{C62} = 2I \cdot R_{50}/R_{42} - I. \tag{8}$$

The output current of FIG. 2A while resistors 46 and 48 are fixed may then be derived by combining equations (1), (4) and (8) which may be shown to be:

$$I_{out} = (2I \cdot R_{50}/R_{42} - I) - (2I \cdot R_{50}/R_{44} - I)$$

which may be simplified to:

$$i \ I_{out} = 2I \cdot R_{50}(1/R_{42} - 1/R_{44}) \tag{9}$$

Referring again to FIG. 1, when the common-mode input voltage is sufficiently low, transistor 38 is biased off and no current flows to current mirror 41. Transistors 16 and 18 are therefore driven into cutoff, and their respective collector currents are zero. Because the collector currents of transistors 16 and 18 are zero, the collector currents of transistors 56 and 58 are equal to the currents through resistors 44 and 42 respectively, and have values given by equations (1) and (2).

Referring now to FIG. 2B, the collector current of transistor 58 flows through transistor 60 and resistor 46. In addition the collector current of transistor 22 also flows through resistor 46 resulting in a total current flow of $2I \cdot R_{50}/R_{42} + I$ through resistor 46. As discussed above, transistor 62 conducts sufficient current to cause the voltage drop across resistors 48 and 46 to be equal. Because resistors 48 and 46 are assumed to have equal values and their voltage drops are equal, their currents must be equal. Also because the collector current of transistor 20 supplies a current of I to resistor 48, transistor 62 must have a collector current of:

$$I_{C62} = (2I \cdot R_{50}/R_{42} + I) - I. \tag{10}$$

Combining equations (4) and (10) and simplifying, the output current can be shown to be:

$$I_{out} = 2I \cdot R_{50}(1/R_{42} - 1/R_{44}). \tag{11}$$

This is the same output current as that derived assuming transistor pair 16–18 was active (see equation (9)). Thus the effect on the output current of varying, i.e. trimming, the values of resistors 42 and 44 is independent of whether transistor pair 16–18 or transistor pair 20–22 is active.

Referring again to FIGS. 2A and 2B, the effect of trimming the values of resistors 46 and 48 will now be analyzed, first with transistor pair 16–18 active and then with transistor pair 20–22 active. It is now assumed that resistors 42, 44, and 50 are fixed and have equal resistances, and that current sources $I_1$ and $I_2$ respectively source and sink a current of 2I. Since resistors 42, 44 and 50 have equal resistances, the current mirror comprising transistors 54, 56, and 58 and resistors 42, 44, and 50, causes the currents through resistors 42 and 44 to be equal to the reference current through resistor 50, or 2I. As discussed above with respect to FIG. 1, when transistor pair 16–18 is active, transistors 16 and 18 each draw a collector current of I, therefore the collector currents of transistors 56 and 58 are 2I–I, or I. The collector current of 58 becomes the reference current for the current mirror comprising transistors 60 and 62 with resistors 46 and 48. Transistor 62 conducts sufficient collector current to cause the voltage drop across resistor 48 to equal the voltage drop across resistor 46 and is given by $I \cdot R_{46}/R_{48}$. The output current, $I_{out}$, is then the difference between the collector currents of transistors 56 and 62, and is given by the equation:

$$I_{out} = I \cdot R_{46}/R_{48} - I, \quad (12)$$

or $$I_{out} = I(R_{46}/R_{48} - 1) \quad (13)$$

when transistor pair 16–18 is active.

Referring again to FIG. 1, when transistors 20 and 22 are active and transistors 16 and 18 are in cutoff, no current flows through the collectors of transistors 16 and 18, so the current through resistor 42, which also flows through transistors 58 and 60, is equal to 2I. Current source 28, which has a value of 2I, supplies a collector current of I to both transistors 20 and 22. The current through resistor 46, therefore, comprises a current of 2I flowing from transistor 60 and a current of I from transistor 22 for a total current of 3I. As discussed above, the current through resistor $R_{48}$ is then given by $3I \cdot R_{46}/R_{48}$. Because a current of I is supplied from transistor 20, the emitter current of transistor 62 is $3I \cdot R_{46}/R_{48} - I$ and the value of $I_{out}$ is $$I_{out} = (3I \cdot R_{46}/R_{48} - I) - 2I, \quad (14)$$

which simplifies to $$I_{out} = 3I(R_{46}/R_{48} - 1). \quad (15)$$

The value of $I_{out}$ when transistor pair 20–22 therefore differs from that obtained when transistor pair 16–18 is active.

Using superposition to combine the results derived above yields the following equations which describe the effects on $I_{out}$ of trimming resistors 42, 4, 46 and 48. When transistor pair 16–18 is active $$I_{out} = 2I \cdot R_{50}(1/R_{42} - 1/R_{44}) + I(R_{46}/R_{48} - 1), \quad (16)$$

and when transistor pair 20–22 is active $$I_{out} = 2I \cdot R_{50}(1/R_{42} - 1/R_{44}) + 3I(R_{46}/R_{48} - 1). \quad (17)$$

From equations (16) and (17) it can be seen that the values of resistors 42 and 44 have an effect on $I_{out}$ that is independent of which input differential amplifier is active, and that the ratio of the resistances of resistors 46 and 48 has an effect on $I_{out}$ which is dependent upon which differential amplifier is active. An op-amp constructed as described can therefore be trimmed in two steps. First, the ratio $R_{46}/R_{48}$ is adjusted by trimming resistors 46 and/or 48 until the input offset voltage is substantially the same regardless of which differential amplifier is active. Then the values of resistors 42 and 44 are trimmed to reduce the input offset of both stages simultaneously.

Based upon the derivation presented hereinabove, the adjustments of resistors 42 and 44, and resistors 46 and 48 are theoretically independent of one another. However, the derivation is based upon several assumptions to simplify the analysis, and there is some interaction between the two adjustments. A more rigorous derivation would yield the following equation when transistor pair 16–18 is active:

$$I_{out} = 2I((R_{50}R_{46})/(R_{42}R_{48}) - R_{50}/R_{44}) - I(R_{46}/R_{48} - 1), \quad (18)$$

and when transistor pair 20–22 is active:

$$I_{out} = 2I((R_{50}R_{46})/(R_{42}R_{48}) - R_{50}/R_{44}) + I(R_{46}/R_{48} - 1). \quad (19)$$

As in the simplified equations, adjustment of resistors 42, 44, and 50 affect both input stage differential amplifiers similarly, whereas adjustment of resistors 46 and 48 affect the input stage differential amplifiers in opposite directions.

Figure 3A:
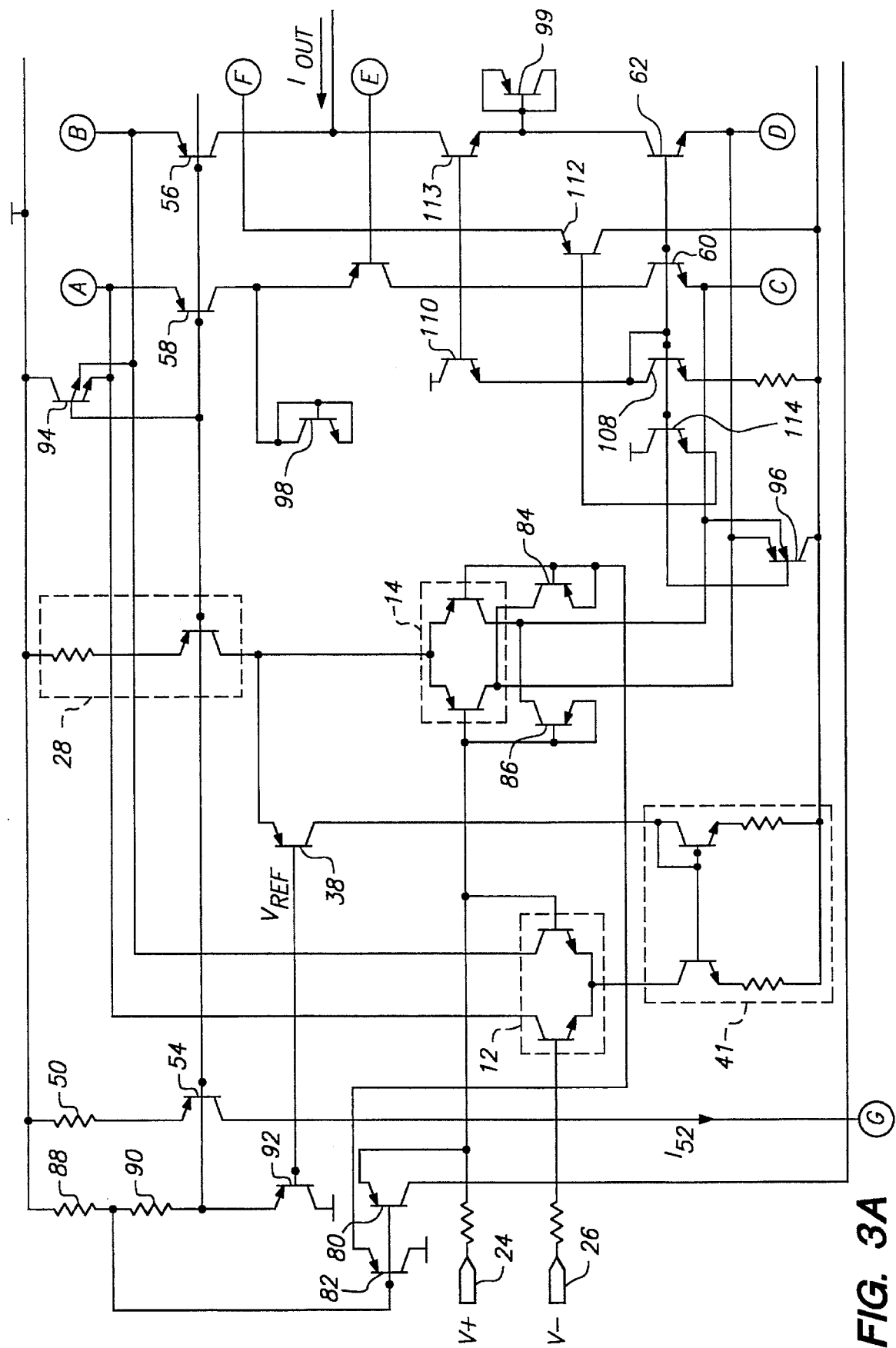
FIGS. 3A, 3B, and 3C are schematic diagrams of a preferred embodiment of the present invention.
Figures 3B, 3C:
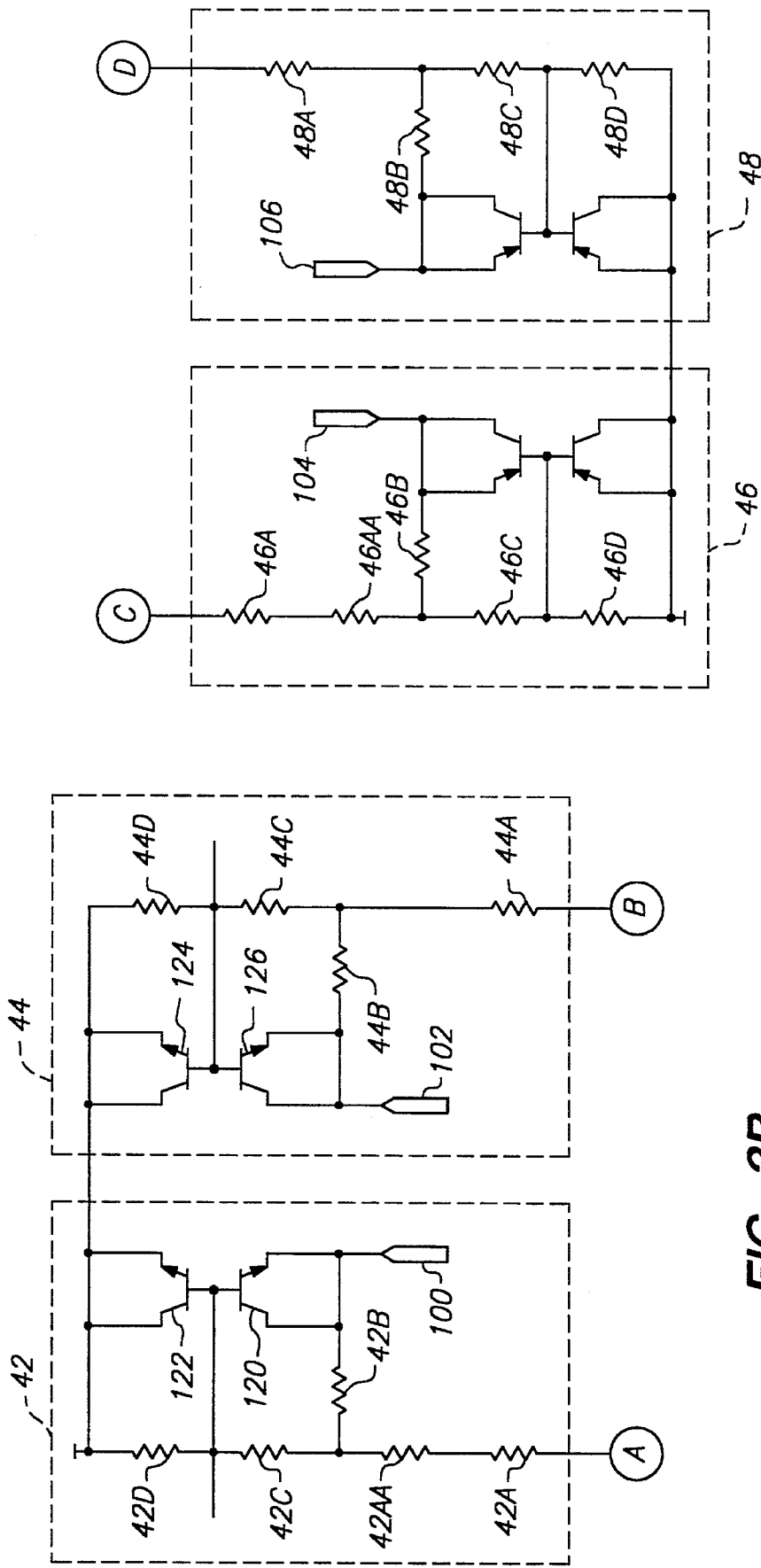

FIGS. 3A, 3B and 3C are a schematic of a preferred embodiment of an operational amplifier having dual input stage differential amplifiers constructed in accordance with the principles of the present invention. In FIG. 3A, those circuit elements identified with the same reference numerals as used in FIGS. 1 and 2, operate substantially as described hereinabove. Transistors 80 and 82 allow an input voltage on terminals 24 and 26 to exceed $V_{CC}$ by a small amount, as determined by resistors 88 and 90. Transistors 84 and 86, similarly, allow an input voltage to go below $V_{EE}$. Transistor 92 in conjunction with transistor 54 sets $V_{ref}$ which is applied to the base of transistor 38 to control the common mode input voltage at which the shift from one input differential amplifier to the other occurs. While trimming the resistance of the networks of FIGS. 3B and 3C, large voltage differences are applied to "zap pads" 100, 102, 104, and 106, which could damage other circuit components. Transistors 94 and 96 act to shunt potentially damaging currents to the supply rails during trimming operations. Transistors 98 and 99 are provided to compensate for leakage current to the substrate in the summing and conversion circuitry. Transistors 108 and 110 provide biasing for the bases of transistors 60 and 62 while transistors 112 and 113 are provided to ensure that the collector voltages of transistors 60 and 62 are substantially the same. Transistor 114 acts as a capacitor for loop stabilization purposes. Additional circuitry (not shown) is coupled to the circuitry at E to ensure the collector voltages of transistors 56 and 58 are substantially equal, and at F and G to provided constant currents for biasing purposes.

FIG. 3B shows trimmable resistive elements corresponding to resistors 42 and 44 of FIGS. 1 and 2. The value of resistor 42 is effectively the combination of the resistance of resistors 42A, 42AA, 42B, 42C, and 42D. By applying appropriate voltage for $V_{CC}$ and $V_{EE}$ and appropriate voltage pulses to "zap" pad 100, transistors 120 and 122 can be selectively and permanently short circuited, thereby altering the total resistance of resistor 42. For example, short circuiting transistor 122 short circuits resistor 42D effectively removing it from the current path, thereby reducing the value of resistor 42 by the resistance of resistor 42D. The value of resistor 44 is provided by resistors 44A, 44B, 44C, and 44D of FIG. 3B, and the value of resistors 46 and 48, are provided, respectively, by resistors 46A, 46AA, 46B, 46C, and 46D, and resistors 48A, 48B, 48C, and 48D of FIG. 3C. The values of resistors 44, 46, and 48 can be trimmed in a manner analogous to that of trimming resistor 42.

During fabrication of the op-amp integrated circuit chip, the input stage is tested to determine values of input offset voltage for each differential amplifier as follows. The input offset voltage characteristics of each input stage differential amplifier are determined by first applying a common mode input voltage so that only differential amplifier 12 is active and measuring its input offset voltage and then applying a second common mode input voltage selected so that only differential amplifier 14 is active and measuring its input offset voltage.

Next the sensitivity of the trim networks are determined. Zap pads 100 and 102 are shorted together and the input offsets of differential amplifiers 12 and 14 are measured as described above. The change in the input offset voltage when the zap pads are shorted is noted for later calculations. The short between zap pads 100 and 102 is removed, and zap pads 104 and 106 are shorted and the input offset voltages of amplifiers 12 and 14 are again measured. From the above procedure four deltas are computed -- $D_{NA}$, $D_{NB}$, $D_{PA}$, and $D_{PB}$ -- where the subscripts N and P refer to NPN differential amplifier 12 and PNP differential amplifier 14 respectively, and subscript A refers to shorting zap pads 100 and 102 together, and subscript B to shorting zap pads 104 and 106 together. Each delta is the change in the input offset voltage of the corresponding differential amplifier with and without the zap pads shorted together. For example, $D_{NA}$ = offset with zap pads 100 and 102 shorted–offset with no zap pads shorted the other deltas being computed in an analogous fashion.

For the circuit of FIG. 3, the number of bits to trim is then calculated by solving the following equations:

$$(V_{OS})_N = (V_{OS})_{NO} + D_{NA}(2+N_A) + D_{NB}(2+N_B) \quad (20)$$

and $$(V_{OS})_P + (V_{OS})_{PO} + D_{PA}(2+N_A) + D_{PB}(2+N_B) \quad (21)$$

where:

$(V_{OS})_{NO}$ = offset of NPN differential amplifier 12 without zap pads shorted.

$(V_{OS})_{PO}$ = offset of PNP differential amplifier 14 without zap pads shorted.

$N_A$ = Number of trim bits in the resistor network of FIG. 3B, and $N_B$ = Number of trim bits in the resistor network of FIG. 3C.

Ideally, $(V_{OS})_N = 0 = (V_{OS})_P$, so equations (20) and (21) may be set equal to each other and solved to find the values of $N_A$ and $N_B$. $N_A$ and $N_B$ will typically be real numbers which must be rounded off to the next higher or lower integer value. There are therefore four pairs of possible integer values for $N_A$ and $N_B$, the pair of values which minimize equations (20) and (21) being selected for trimming the integrated circuit.

Which of transistors 120, 122, 124 and 126 to zap is then determined from Table 1 below based on the value of $N_A$. A similar table determines which of transistors 128, 130, 132, and 134 to zap based on the value of $N_B$. Appropriate voltage pulses are then applied to the zap pads to permanently short selected transistors of the trim network and thereby minimize

TABLE 1

| $N_A$ | 102 | 104 | 106 | 108 |
|---|---|---|---|---|
| −8 | 0 | 1 | 1 | 0 |
| −7 | 1 | 1 | 1 | 0 |
| −6 | 0 | 0 | 1 | 0 |
| −5 | 1 | 0 | 1 | 0 |
| −4 | 0 | 1 | 0 | 0 |
| −3 | 1 | 1 | 0 | 0 |
| −2 | 0 | 0 | 0 | 0 |

TABLE 1-continued

| $N_A$ | 102 | 104 | 106 | 108 |
|---|---|---|---|---|
| −1 | 1 | 0 | 0 | 0 |
| 0 | 0 | 1 | 1 | 1 |
| 1 | 1 | 1 | 1 | 1 |
| 2 | 0 | 0 | 1 | 1 |
| 3 | 1 | 0 | 1 | 1 |
| 4 | 0 | 1 | 0 | 1 |
| 5 | 1 | 1 | 0 | 1 |
| 6 | 0 | 0 | 0 | 1 |
| 7 | 1 | 0 | 0 | 1 |

1 = zap
0 = don't zap the input offset characteristic of the op-amp. For example, to zap transistor 120, $V_{CC}$ is set to 0 volts, $V_{EE}$ is set to −35 volts, and a pulse of −25 volts is applied to zap pad 100.

Alternatively, resistors 42, 44, 46, and 48 of FIG. 1 may comprise thin film resistors which are trimmed using laser trimming techniques in a two stage process. The offset voltage ($V_{OS}$) of each input stage differential amplifier is measured and a target $V_{OS}$ is calculated from:

$$\text{Target } V_{os} = \frac{m1[m0 \cdot (V_{os})_{N0} - (V_{os})_{P0}]}{[m0 - m1]} \quad (22)$$

where:

m0 = 3.00, and m1 = 0.88

The constants m0 and m1 are initially determined by analysis or circuit simulation to determine the effects of trimming each resistance on the input offset of the differential amplifiers. Their values are subsequently adjusted based on statistical analysis of the effect of trimming actual integrated circuit devices. A 0 volt common mode input is applied to the circuit being trimmed, and the value of resistors 46 and 48 are coarse trimmed until the target $V_{OS}$ is reached and the offset voltages are measured ($(V_{OS})_{N1}$ and $(V_{OS})_{P1}$). Then resistors 42 and 44 are coarse trimmed until the offset voltage is substantially zero volts.

Following the coarse trim of resistors 42 and 44, the input offset voltages of the differential amplifiers are again measured ($(V_{OS})_{N2}$ and $(V_{OS})_{P2}$) and new values of m0 and m1 are calculated, where $$m0 = \frac{(V_{os})_{P0} - (V_{os})_{P1}}{(V_{os})_{N0} - (V_{os})_{N1}} \quad (23)$$

and $$m1 = \frac{(V_{os})_{P1} - (V_{os})_{P2}}{(V_{os})_{N1} - (V_{os})_{N2}} \quad (24)$$

The target $V_{OS}$ is recalculated using the new values of m0 and m1, and a fine trim of resistors 42, 44, 46, and 48 are performed using the same procedure as the coarse trim.

Although preferred embodiments of the inventions have been disclosed, with various components connected to other components, persons skilled in the art will appreciate that it may not be necessary for such connections to be direct and that additional components may be interconnected without departing from the spirit of the invention. Persons skilled in the art will also appreciate that the present invention can be practiced by other than the described embodiment. The described embodiments are presented for purposes of illustration and not of limitation, and the present invention is limited only by the claims that follow.

What is claimed is:

1. Input stage circuitry for an operational amplifier integrated circuit having two input terminals, the input stage circuitry comprising:

first and second differential amplifiers having inputs coupled in parallel to the two input terminals;

steering circuitry coupled between the first and second differential amplifiers and to a reference voltage, the steering circuitry for controlling the ratio of operating currents through the first and second differential amplifiers based upon the relationship of a common-mode voltage at the two input terminals to the reference voltage;

first trimmable resistive elements coupled between outputs of the first and second differential amplifiers and a first voltage source, wherein resistances of the first trimmable resistive elements are selected so that offset voltage characteristics of the first and second differential amplifiers are substantially the same; and second trimmable resistive elements coupled between the output of the first and second differential amplifiers and a second voltage source, wherein resistances of the second trimmable resistive elements are selected so that the offset voltage characteristics of the first and second differential amplifiers are substantially minimized.

2. The input stage circuitry of claim 1 further comprising summing and conversion circuitry coupled to outputs of the first and second differential amplifiers, for summing signals from the outputs of the first and second differential amplifiers and converting the summed signal to a single ended output signal.

3. Circuitry for an input stage of a high precision operational amplifier integrated circuit having two input terminals, the circuitry comprising:

a first differential amplifier, coupled to the input terminals;

a first current mirror coupled between the first differential amplifier and a first biasing voltage;

a second differential amplifier coupled to the input terminals, in parallel with the first differential amplifier;

a first current source coupled between a second biasing voltage and the second differential amplifier, for providing a biasing current to the second differential amplifier;

circuitry coupled to the first current source, to the first current mirror, and to the second differential amplifier, the circuitry for selectively directing current from the first current source to either the first current mirror or to the second differential amplifier;

first trimmable resistors coupled between the second differential amplifier and the second biasing voltage, wherein resistances of the first trimmable resistors are selected so that voltage offset characteristics of the first and second differential amplifiers are substantially the same; and second trimmable resistors coupled between the first differential amplifier and the first biasing voltage, wherein resistances of the second trimmable resistors are selected so that the voltage offset characteristics of the first and second differential amplifiers are substantially minimized.

4. The circuitry of claim 3 further comprising circuitry coupled between the first and second trimmable resistors for summing differential outputs of the first and second differential amplifiers and converting the summed outputs into a single ended output.

5. Circuitry for a dual differential amplifier input stage for use in a high precision operational amplifier integrated circuit, the circuitry comprising:

first and second differential amplifiers having inputs coupled to input terminals of the operational amplifier integrated circuit;

first resistor-ratioed current mirror, including first and second resistive elements, coupled to outputs of the first and second differential amplifiers, wherein resistances of the first and second resistive elements are selected so that offset characteristics of the first and second differential amplifiers are approximately the same;

a second resistor-ratioed current mirror, including third and fourth trimmable resistive elements, coupled to the outputs of the first and second differential amplifiers, wherein resistances of the third and fourth trimmable resistive elements are selected so that the offset characteristics of the first and second differential amplifiers are substantially minimized;

a current source coupled to the second differential amplifier; and steering circuitry coupled to the first and second differential amplifiers and to a reference signal, the steering circuitry for directing current from the current source to the first and second differential amplifiers in a ratio determined by the relationship between a common-mode input signal and the reference signal.

6. Circuitry for an input stage of an operational amplifier having first and second input terminals, the circuitry comprising:

a first differential amplifier comprising a first NPN transistor having a base coupled to the first input terminal and a second NPN transistor having a base coupled to the second input terminal and an emitter coupled to an emitter of the first NPN transistor;

a second differential amplifier comprising a first PNP transistor having a base coupled to the first input terminal and a second PNP transistor having a base coupled to the second input terminal and an emitter coupled to an emitter of the first PNP transistor;

first and second resistors capable of being trimmed, the first and second resistors being coupled between a first biasing voltage and collectors of the first and second PNP transistors, respectively, wherein resistances of the first and second resistors cause offset voltage characteristics of the first and second differential amplifiers to be approximately equal;

third and fourth trimmable resistive elements coupled between a second biasing voltage and collectors of the first and second NPN transistors, respectively, wherein resistances of the third and fourth resistors cause the offset voltage characteristics of the first and second differential amplifiers to be minimized;

a current steering circuit coupled between emitter circuits of the first and second differential amplifiers, for controlling the ratio of the operating currents of the first and second differential amplifiers responsive to a common-mode voltage present on the first and second terminals; and a conversion circuit coupled between the collectors of the first and second NPN transistors and the first and second PNP transistors, and coupled to an output node, the output circuit for generating an output current based on current differentials between the collector currents of the first and second NPN transistors, and also based on current differentials between the collector currents of the first and second PNP transistors.

7. Input circuitry for an integrated circuit precision operational amplifier having first and second input terminals, the circuitry comprising:

a first input stage differential amplifier having first and second inputs coupled in parallel to the first and second input terminals;

a second input stage differential amplifier having first and second inputs coupled in parallel to the first and second input terminals;

a steering circuit coupled to the first and second input stage differential amplifiers which controls the ratio of operating current passing through the first and second input stage differential amplifiers based on input signals applied to the first and second input terminals;

at least one first trimmable resistive element coupled to the first and second input stage differential amplifiers, wherein a resistance of the at least one first trimmable resistive element causes offset voltage characteristics of the first and second input stage differential amplifiers to be substantially equal; and at least one second trimmable resistive element coupled to the first and second input stage differential amplifiers, wherein a resistance of the at least one second trimmable resistive element causes the offset voltage characteristics of the first and second input stage differential amplifiers to be substantially minimized.

8. The circuitry of claim 7 further comprising summing and conversion circuitry coupled to outputs of the first and second input stage differential amplifiers, wherein the summing circuitry sums signals from the outputs of the first and second input stage differential amplifiers and the conversion circuitry converts the summed signal to a single ended output signal.

9. The circuitry of claim 7 wherein the at least one first trimmable resistive element comprises a plurality of trimmable resistive elements.

10. The circuitry of claim 7 wherein the at least one second trimmable resistive element comprises a plurality of trimmable resistive elements.

11. An input stage circuit of a precision integrated circuit operational amplifier having two input terminals, the input stage comprising:

a first differential amplifier coupled to the two input terminals;

a first driving circuit coupled to the first differential amplifier for driving the first differential amplifier in response to a first bias voltage;

a second differential amplifier coupled to the two input terminals;

a second driving circuit coupled to the second differential amplifier for driving the second differential amplifier in response to a second bias voltage;

a directing circuit coupled to the first and second driving circuits for selectively controlling the ratio of current at which the driving circuits drive their respective differential amplifiers;

at least one first trimmable resistive element coupled to the first and second differential amplifiers, wherein resistances of the at least one first trimmable resistive element is selected so that input offset voltages of the first and second differential amplifiers are approximately equal; and at least one second trimmable resistive element coupled to the first and second differential amplifier, wherein resistances of the at least one second trimmable resistive element is selected so that the input offset voltages are minimized.

12. The circuitry of claim 11 further comprising summing and conversion circuitry coupled to outputs of the first and second differential amplifiers, wherein the summing circuitry sums signals from the outputs of the first and second differential amplifiers and the conversion circuitry converts the summed signal to a single ended output signal.

13. The input stage circuit of claim 11 wherein the at least one first and second trimmable resistive elements each comprises a plurality of resistive elements and switches, wherein the switches are capable of being permanently shorted, and wherein the resistive elements and switches are coupled together so that shorting selected ones of the plurality of switches shorts selected ones of the plurality of resistive elements, thereby altering a resistance of the resistive element.

14. A method for trimming the input stage of a precision integrated circuit operational amplifier to minimize its input offset voltage characteristic, the operational amplifier having first and second input stage differential amplifiers each having an input offset voltage characteristic, the method comprising:

providing first trimmable resistive elements coupled to outputs of the first and second differential amplifiers such that adjusting resistive values of the first trimmable resistive elements has substantially the same effect on the input offset voltage characteristic of both the first and second differential amplifiers;

providing second trimmable resistive elements coupled to outputs of the first and second differential amplifiers such that adjusting resistive values of the second trimmable resistive elements has an effect on the input offset voltage characteristic of the first differential amplifier and a substantially smaller effect on the input offset voltage characteristic of the second differential amplifiers;

measuring the input offset voltage characteristics of the first and second differential amplifiers;

adjusting the resistive value of the second trimmable resistive elements so that the input offset characteristics of the first and second differential amplifiers are substantially the same; and adjusting the resistive value of the first trimmable resistive elements so that the input offset characteristics of both the first and second differential amplifiers are substantially minimized.

15. The method of claim 14 wherein the steps of providing first and second trimmable resistive elements comprises the steps of providing, respectively, first and second networks of resistors and switches, and the step of adjusting the first and second resistive elements comprises selectively opening or closing a switch, thereby changing a total resistance of the network of resistors and switches.

16. The method of claim 15 wherein the switches comprise transistors and the step of selectively closing a switch comprises permanently shorting a base-emitter junction of a transistor.

17. The method of claim 15 wherein the switches comprise metal links and the step of selectively opening a switch comprises melting the metal link.

18. The method of claim 14 wherein the steps of providing first and second trimmable resistive elements comprises providing thin film resistors, and the step of adjusting a resistive value comprises laser trimming the thin film resistors.

19. The method of claim 18 wherein the steps of measuring and adjusting comprise a coarse adjustment of the resistive values of the first and second resistive elements, the method further comprising the step of repeating the measuring and adjusting steps to finely adjust the resistive value.

20. The method of claim 14 wherein each of the first and second resistive elements comprises a plurality of resistors and transistors coupled to form a resistive network, wherein the each one of the plurality of transistors may be selectively shorted to alter a total resistance of the resistive network.

21. The method of claim 20 wherein the steps of adjusting resistive values further comprise steps of analyzing the measured input offset voltages of the complementary differential amplifiers and adjusting the resistive values responsive to the analysis.

22. A method comprising:

providing an integrated circuit operational amplifier, an input stage of the operational amplifier comprising:

complementary differential amplifiers;

first and second resistive elements coupled to the outputs of the complementary differential amplifiers such that adjusting resistive values of the first and second resistive elements has substantially different effects on the input offset voltages of the complementary differential amplifiers; and third and fourth resistive elements coupled to outputs of the complementary differential amplifiers such that adjusting resistive values of the third and fourth resistive elements has substantially the same effect on input voltage offsets of the complementary differential amplifiers;

measuring the input offset voltages of each of the complementary differential amplifiers;

adjusting resistive values of at least one of the first and second resistive elements responsive to the input offset voltages of the complementary differential amplifiers being substantially different; and adjusting resistive values of at least one of the second and third resistive elements responsive to the input offset voltages of the complementary differential amplifiers being substantially non-zero.

* * * * *